United States Patent [19]
Seto et al.

[11] Patent Number: 5,699,387
[45] Date of Patent: Dec. 16, 1997

[54] PHASE OFFSET CANCELLATION TECHNIQUE FOR REDUCING LOW FREQUENCY JITTERS

[75] Inventors: Jim M. N. Seto, North York; Roger P. Colbeck, Whitby; Raymond Chau, Toronto; Simon C. F. Leung, Markham, all of Canada

[73] Assignee: ATI Technologies Inc., Thornhill, Canada

[21] Appl. No.: 80,183

[22] Filed: Jun. 23, 1993

[51] Int. Cl.⁶ .................................................. H04L 7/033
[52] U.S. Cl. ........................... 375/376; 375/374; 327/157
[58] Field of Search ........................... 375/374, 375, 375/376; 331/1 R, 1 A, 17, 25; 326/93; 327/147–153, 156–161, 163

[56] References Cited

U.S. PATENT DOCUMENTS

| | | | |
|---|---|---|---|
| 4,885,554 | 12/1989 | Wimmer | 331/25 |
| 4,908,841 | 3/1990 | Leis et al. | 375/327 |
| 5,036,216 | 7/1991 | Hohmann et al. | 307/269 |
| 5,052,022 | 9/1991 | Nishita et al. | 375/120 |
| 5,079,520 | 1/1992 | Rapeli | 331/1 A |
| 5,081,655 | 1/1992 | Long | 331/1 A |
| 5,097,489 | 3/1992 | Tucci | 375/374 |
| 5,142,246 | 8/1992 | Petersson | 331/11 |
| 5,166,641 | 11/1992 | Davis et al. | 331/1 A |
| 5,278,702 | 1/1994 | Wilson et al. | 360/51 |
| 5,313,499 | 5/1994 | Coburn | 375/120 |
| 5,432,481 | 7/1995 | Saito | 331/45 |

FOREIGN PATENT DOCUMENTS

| | | | |
|---|---|---|---|
| 0026165 | 1/1990 | Japan | 375/120 |
| 8904094 | 5/1989 | WIPO | 375/120 |

*Primary Examiner*—Young T. Tse
*Attorney, Agent, or Firm*—Pascal & Associates

[57] ABSTRACT

A phase locked loop is comprised of a phase-frequency detector for providing to a charge pump up and down pulse signals having pulse widths proportional to phase differences between a pair of signals applied thereto, apparatus for introducing a relative phase difference between a first clock signal and a second signal to provide the pair of signals, the second signal being synchronized with an output signal of the loop, apparatus for providing a third up or down signal to the charge pump offsetting the effect of the introduced phase difference, and apparatus for obtaining a loop control voltage from the charge pump.

12 Claims, 7 Drawing Sheets

PHASE OFFSET CANCELLATION TECHNIQUE FOR REDUCING LOW FREQUENCY JITTERS

FIELD OF THE INVENTION

This invention relates to the field of digital signal phase-frequency controllers, and in particular to one for use in a phase locked loop.

BACKGROUND TO THE INVENTION

Phase locked loops control the phase and frequency of an output signal generated in a voltage controlled oscillator by comparing the phase of a representation of the output signal with a reference signal in a phase-frequency detector, which reference signal is described herein as a clock signal. The clock signal can of course be any digital signal with which the output signal is to be aligned, and it is intended that the term should be construed as such herein.

While phase locked loop designs have existed for a long time, phase locked loops which exhibit low jitter and at the same time operate at high frequencies can be expensive, because they require sophisticated technologies such as bipolar or analog CMOS, or require the use of discrete components. Low cost phase locked loops have been restricted to lower frequencies such as below 80 MHz, and exhibit poorer performance (high jitter) and can also require the use of discrete components. It has been found in the past that trade-offs are required to be made between high performance and low cost.

The most common phase-frequency detector is a Type IV, edge-sensitive sequential (digital) phase-frequency detector. The output of this detector is a series of "up" and "down" pulses which are used to control a charge pump. These up and down pulses are proportional to the phase difference of the inputs to the detector. When connected to a charge pump, the result is a voltage which is also proportional to the phase difference of the inputs.

An inherent problem with this kind of phase detector is its susceptibility to low frequency jitter. This occurs when the phase difference is close to zero and the output voltage "wanders" around a desired operating point, and the phase detector does not respond to this variation in phase. This is sometimes referred to as the "dead zone" in the phase detector. Such behavior of the phase detector is not acceptable in high frequency signal synthesis applications.

One technique to get around this problem is described in U.S. Pat. No. 5,036,216 issued Jul. 30, 1991, invented by J. W. Hohmann et al. The phase-frequency detector is operated away from the "dead zone". This reduced the jitter, but the trade off is that it operates with a deliberate phase offset. This is undesirable in applications such as data alignment and/or clock realignment, in which minimal static phase offset is crucial. The technique used in the referenced patent is to employ a mono-stable multivibrator to introduce a third slow-speed control signal to the charge pump. This control signal is a pulse which shifts the operating point away from the dead zone.

Frequency limitations of a Type IV phase-frequency detector is described in the article "Frequency Limitations of a Conventional Phase-Frequency Detector" by M. Soyuer et al, IEEE Journal of Solid-State Circuits, volume 25, no. 4, August 1990, pp 1019–1022.

SUMMARY OF THE INVENTION

The present invention is a phase locked loop, and a method of controlling the operating point of a phase-frequency detector therein, which eliminates low frequency jitter, operates with no static phase offset, and is immune to process, temperature and voltage variations. As such it can be used in both frequency synthesis and clock realignment applications, in which the aforenoted prior art structure cannot.

In accordance with the present invention, a deliberate phase offset is introduced into either the clock signal or the compared signal prior to presentation to the phase-frequency detector, which biases the operation point of the phase detector away from the dead zone. The effect of the phase offset is also applied to the charge pump in a manner to compensate for the effect of the offset applied to the phase-frequency detector. The result is to shift the operating point of the phase-frequency detector away from its dead zone, and to shift the charge bias away from that resulting from the phase offset. In short, the invention utilizes a feed forward approach, using a delay line in one embodiment, to introduce an offset shifting the operating point of the phase-frequency detector and then cancelling the effect of the offset in the oscillator control signal. Thus while the phase-frequency detector operates away from the dead zone, there is no phase bias in the output signal. The invention thus reduces jitter without introducing static phase offset.

In accordance with an embodiment of the invention, a method of controlling the operating point of a Type IV phase-frequency detector which outputs signals proportional to the phase difference between a reference and a controlled signal is comprised of phase offsetting either the reference or controlled signal prior to application, thereof to the detector and compensating an output signal of the detector so as to cancel the effect of the phase offset therein, whereby the operating point of the detector is biased to a position offset from its dead zone but the effect of bias is avoided in the output signal.

In accordance with another embodiment, a phase locked loop is comprised of a phase-frequency detector for providing to a charge pump up and down pulse signals having pulse widths proportional to phase differences between a pair of signals applied thereto, apparatus for introducing a relative phase difference between a first clock signal and a second signal to provide the pair of signals, the second signal being synchronized with an output signal of the loop, apparatus for providing a third up or down signal to the charge pump offsetting the effect of the introduced phase difference, and apparatus for obtaining a loop control voltage from the charge pump.

BRIEF INTRODUCTION TO THE DRAWINGS

A better understanding of the invention will be obtained by reference to the detailed description below, in conjunction with the following drawings, in which:

FIG. 2 is a more detailed block diagram of an analog portion of the phase locked loop of FIG. 1, FIGS. 3A, 3B, 3C and 3D respectively show voltage VS-phase operating characteristics of a phase-frequency detector, a clock reference input signal Ckin and compared output signal Ckfeed, (a) for a theoretically ideal circuit, (b) for a normal Type IV circuit, (c) for the circuit described in the aforenoted U.S. Pat. No. 5,036,216 and (d) for the present invention, respectively.

DETAILED DESCRIPTION OF THE INVENTION

Figure 1:
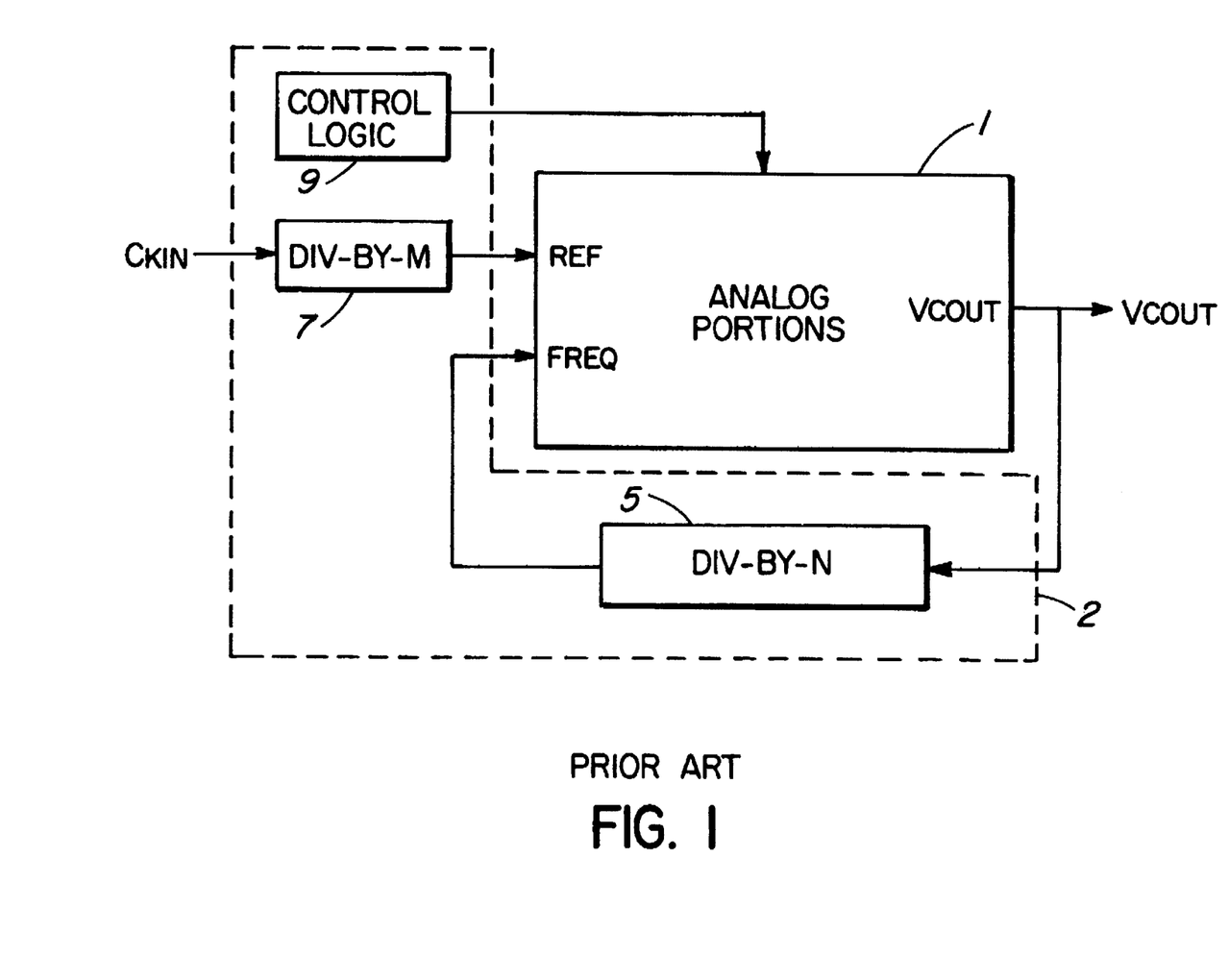
FIG. 1 is a block diagram of a prior art phase locked loop.

A typical phase locked loop is shown in FIG. 1. This structure is comprised of an analog portion 1 having a reference input (for receiving a clock signal) and a frequency input (for receiving a comparison signal), and a controlled voltage output signal Vcout. The phase locked loop includes a digital portion 2 which includes a divide by N counter 5, which presents a signal to the frequency input of the analog portion 1 in phase with the output signal. Clock signal Ckin is provided to an optional divide by M counter 7, the output of which is applied to the reference input of the analog portion. Control logic 9 controls the operation of the analog portion 1.

Figure 2:
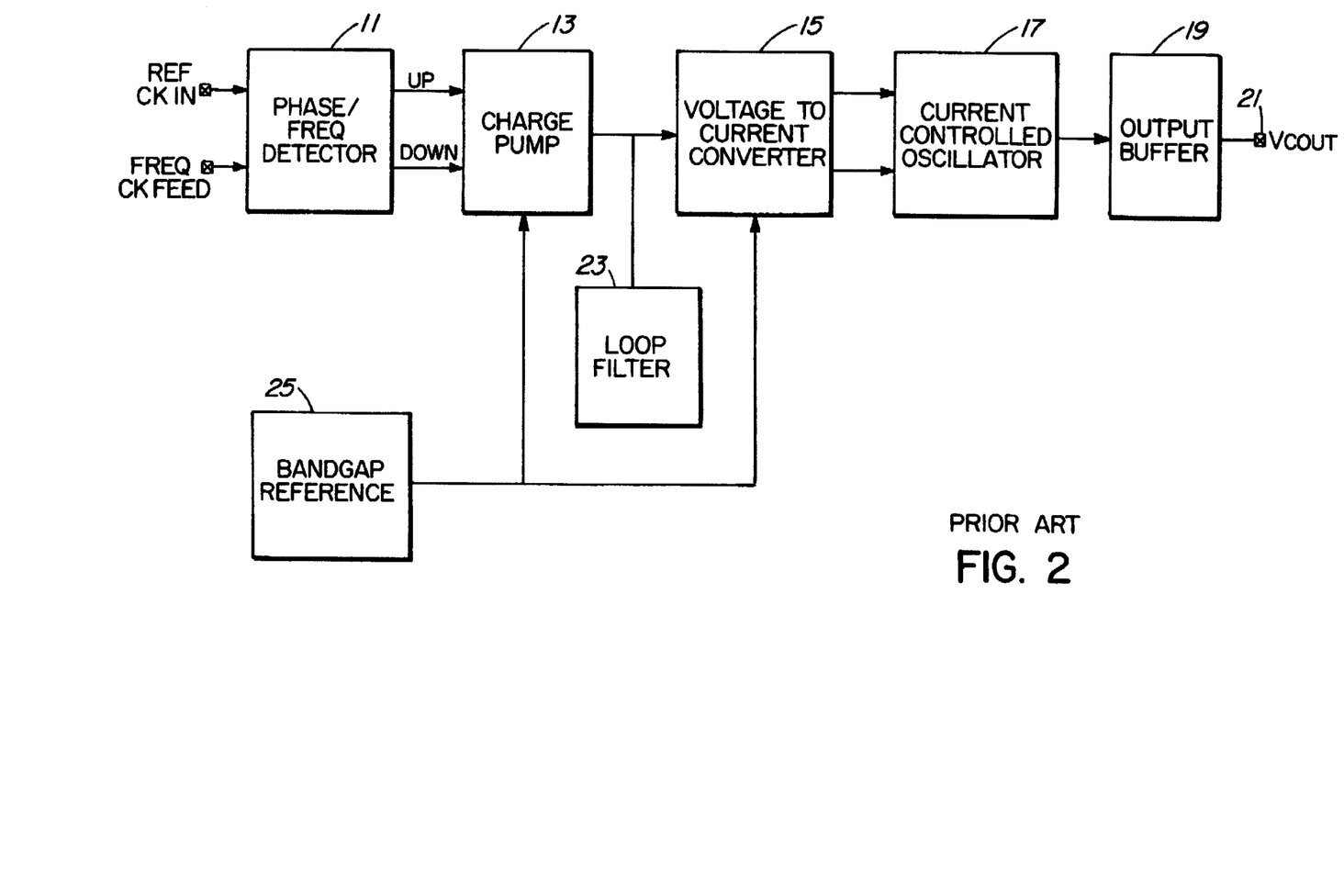

FIG. 2 is a more detailed block diagram of the analog portion 1. A phase-frequency detector 11 receives the Ckin reference and Ckfeed frequency inputs, and outputs up and down signals to a charge pump 13. The function of these two circuits will be described in more detail below. The output of the charge pump is a control voltage for application to a voltage controlled oscillator, the output voltage of which is proportional to the phase difference between the reference signal Ckin and the feedback signal Ckfeed at the frequency input.

Rather than utilizing a voltage controlled oscillator, current control oscillators are often used as shown in FIG. 2. A voltage to current converter 15 receives the output signal voltage of the charge pump 13 and provides a control signal current to current controlled oscillator 17. The output of oscillator 17 is applied to an output buffer 19, if the buffer is not already part of the oscillator 17, to provide a controlled output signal Vcout 21.

A loop filter 23 is connected at the output of charge pump 13, and a voltage reference circuit 25 is connected to the charge pump 13 and converter 15.

Operation of the above-described circuit is well known, and is described in the aforenoted U.S. Pat. No. 5,036,216. However reference is now made to FIG. 4, which illustrates the prior art phase-frequency detector 11 and charge pump 13 in more detail.

Figure 4:
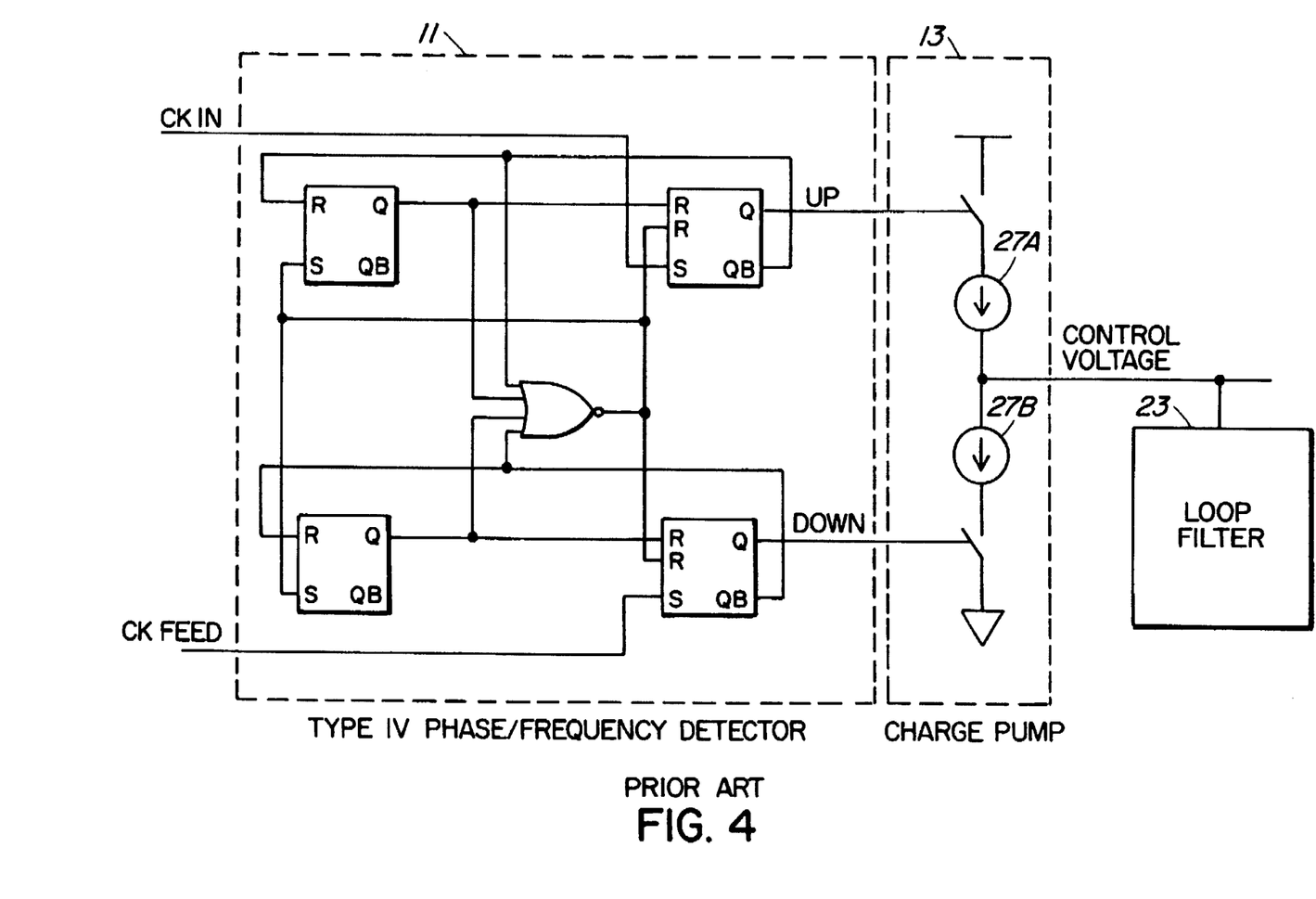
FIG. 4 illustrates a conventional phase-frequency detector and charge pump.

A Type IV phase-frequency detector 11 as shown in FIG. 4 is comprised of four RS latches and one NOR gate. The output of the detector 11 is a series of up and down pulses that are used to control the charge pump 13. These up and down pulses are proportional to the phase difference between the Ckin and Ckfeed input signals. The result is a control voltage output of the charge pump that is also proportional to the phase difference between the input signals.

Such a detector is sensitive to only one edge, e.g. the rising edge of the input signals. It is thus insensitive to duty cycle variations and to false-locking due to harmonics, which are desirable features. However it does not detect low frequency jitter. The pulse widths of the up and down signals are proportional to the phase differences between the Ckin and Ckfeed signals. When the phase locked loop signal is close to locking, the detector cannot resolve small phase differences, and thus manifests itself in the form of jitter, where the synthesize frequency hovers above and below the desired frequency.

The resulting up and down pulses are applied to current sources 27A and 27B that either sink or source current into the loop filter. This represents how the control voltage to the voltage controlled oscillator is modulated to reflect the change in phase.

In this patent application, including the claims, a current source which sources current to the control voltage output is referred to as a current source, while a current source which sinks current from the control voltage output is referred to as a current sink. However it may be seen from the block diagram of FIG. 4 that they can both be current sources, each connected in series with an electronic switch operated by the up and down pulses respectively, in a direction between a power rail and ground so as to either source or sink current relative to the control voltage output, respectively.

Figure 3A:
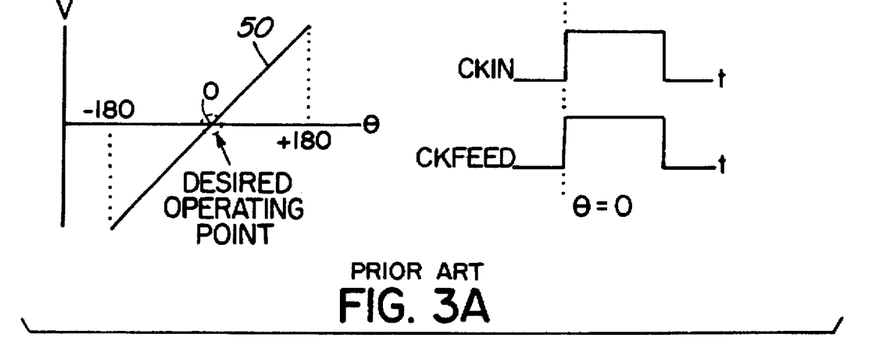

FIG. 3A illustrates an ideal voltage compensation characteristic 50. The desired operating point is at zero, the intersection of the characteristic line 50 with the horizontal axis. The voltage characteristic is representative of the amplitude of the up and down signals, above and below the horizontal axis, depending on whether the fed back signal is leading or lagging in phase with respect to the reference clock signal. It may be seen that the fed back Ckfeed signal in this ideal situation has its leading edge exactly in phase with the leading phase of the Ckin signal, with no jitter.

Figure 3B:
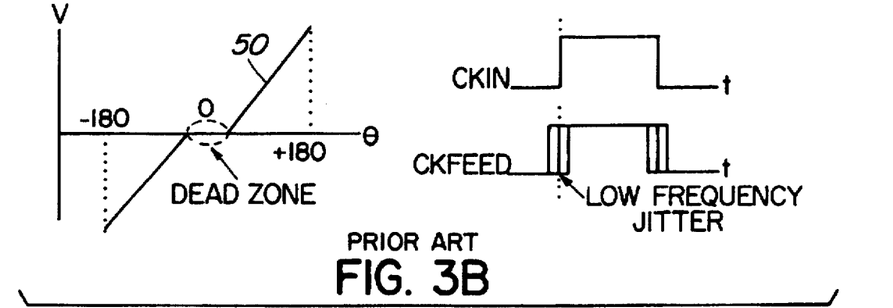

As shown in FIG. 3B, the characteristic 50 exhibits a "dead zone" when the phase difference is close to zero. The resulting output voltage of the phase-frequency detector wanders about the desired operating point, and the phase detector does not respond to this variation in phase. The result is low frequency jitter, as illustrated by the wandering and changing leading edge point of the Ckfeed signal relative to the Ckin signal.

Figure 5:
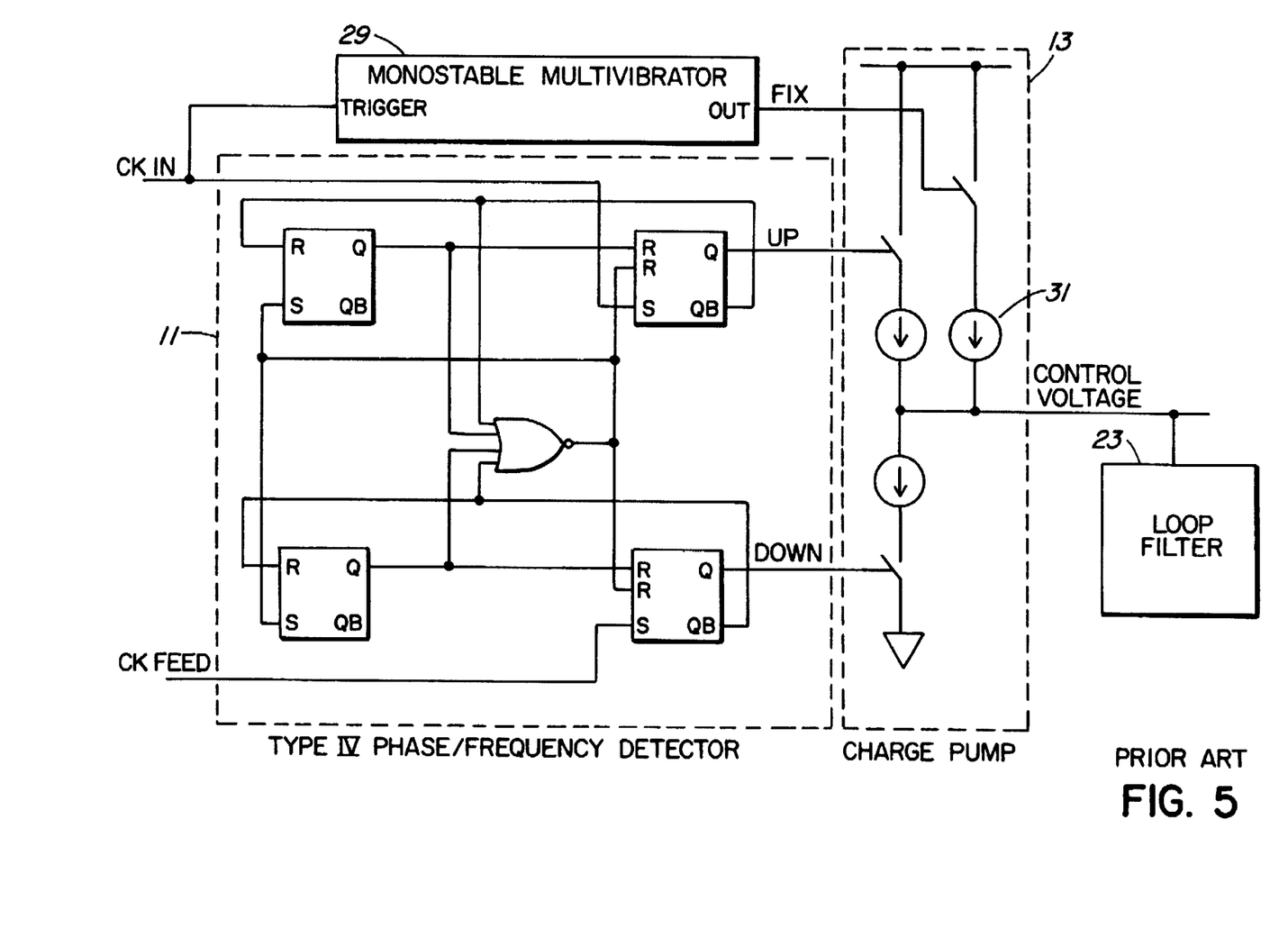
FIG. 5 illustrates the phase-frequency detector and charge pump in accordance with the aforenoted U.S. Pat. No. 5,036,216.

FIG. 5 illustrates a phase-frequency detector and charge pump in accordance with the aforenoted U.S. Pat. No. 5,036,216 which deals with the dead zone. The circuit is basically the same as in FIG. 4, but in this case, a monostable multivibrator 29 receives at its trigger input the clock input signal, and outputs a FIX control signal. This FIX signal is used as a control voltage to an electronic switch connected in series with a third current source 31 (or sink) in the charge pump 13. The function of this third FIX signal is to introduce a phase offset to the entire system.

Figure 3C:
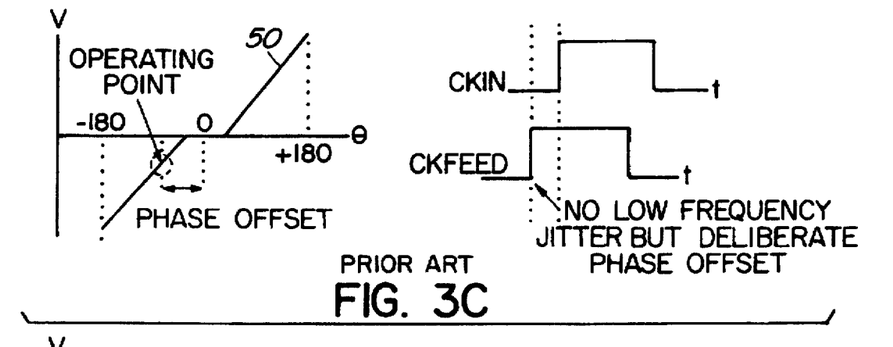

FIG. 3C illustrates the voltage characteristic 50 at the output of the frequency-phase detector of that system. A deliberate phase offset is introduced to establish an operating point at the position shown which is removed from the dead zone. As may be seen from the illustrated signals, since the operating point is removed from the dead zone, there is no jitter in the leading edge of the Ckfeed signal, but there is a deliberate phase offset of that leading edge relative to the reference Ckin clock signal.

This phase offset is proportional to the pulse width (delay) of the multivibrator 29.

In frequency synthesis application where a static phase offset between the reference and synthesize frequency is not important, such a structure may be acceptable. However in applications where clock alignment or data alignment are crucial, introducing such a phase offset is unacceptable.

In addition, the static phase offset introduced into the structure of FIG. 5 will vary, because the pulse width of the FIX signal is set by the multivibrator, and this will vary across process, temperature and operating voltage. Thus, with process, voltage and temperature variations, the pulse width of the FIX signal will vary widely, and the static phase offset will be different from one phase locked loop to another. These are of course undesirable effects.

Figure 6:
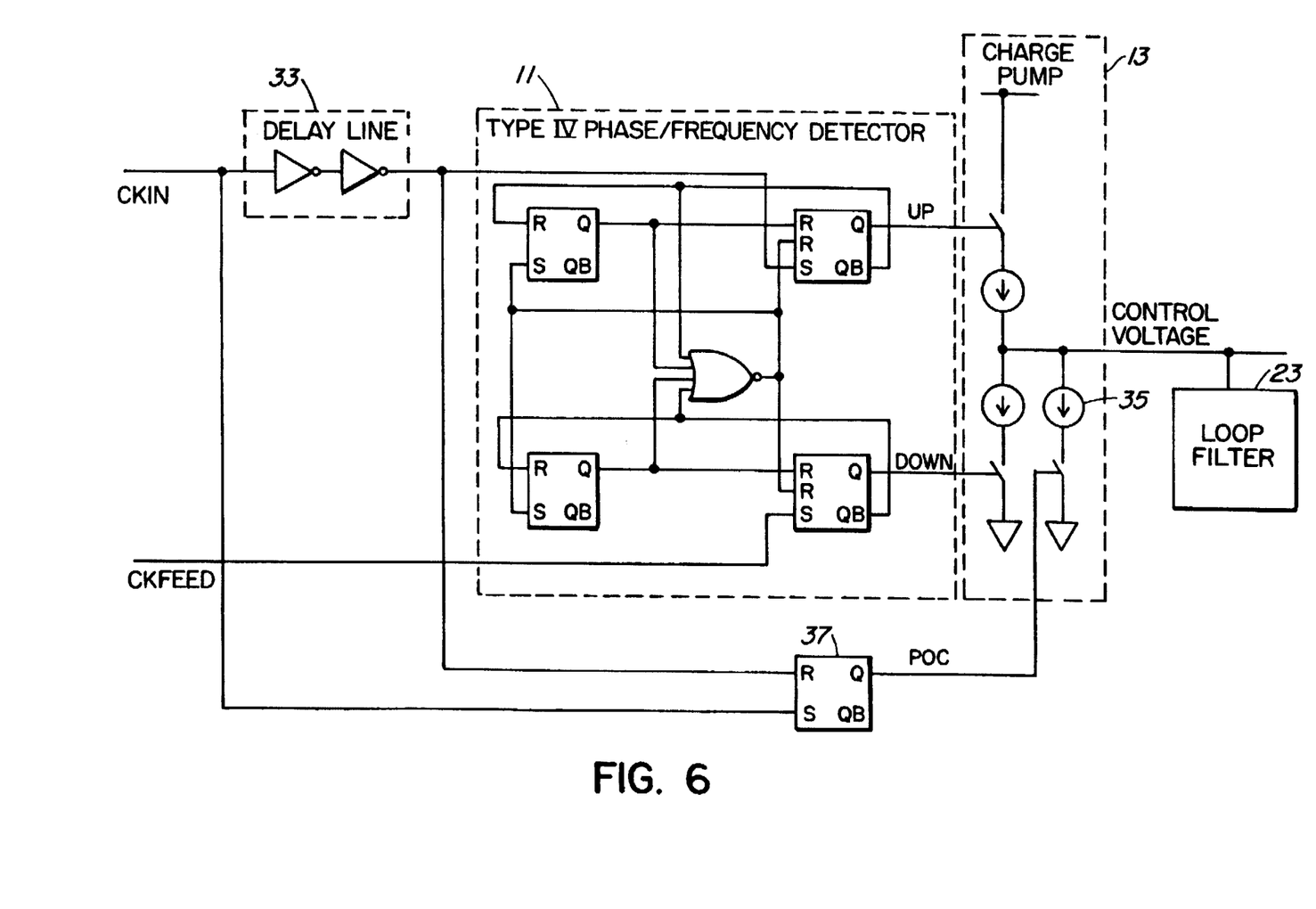
FIGS. 6 and 6A illustrate an embodiment of the present invention.

A block diagram of the present invention is illustrated in FIG. 6. This structure eliminates low frequency jitter, operates with no static phase offset and is immune to process, temperature and voltage variations. As such it can be used in both high frequency signal synthesis and clock realignment applications, which is not feasible with the aforenoted designs.

In accordance with the present invention, a delay such as provided by a delay line 33 is introduced into the signal path of either one of the Ckin or Ckfeed signals. The former is shown in FIG. 6. The effect of this is to create a phase difference between the Ckin and Ckfeed signals. This forces the phase-frequency detector to operate away from the dead zone and to ensure that there is no low frequency jitter.

As a result, with the embodiment shown, when the phase locked loop is locked, there is a continuous sequence of up pulses output from detector 11. The width of these up pulses is the same as the time delay of the delay line 33.

A phase offset cancellation signal POC is applied to a third current sink or source 35 in the charge pump. In the embodiment shown in FIG. 6, the structure is a current sink connected via an electronic switch enabled by the POC signal, between the control voltage signal line and ground.

The POC signal is obtained as an output from flip-flop 37 whose set and reset inputs are connected to the input and output respectively of delay line 33, thus receiving the undelayed and delayed representations of the Ckin signal. The pulse width of the POC signal is thus the same as the pulse width of the up signal.

As a result, when the phase locked loop is locked, there is no net change in the amount of charge injected into or taken away from the control voltage line, and hence there is a constant control voltage. A constant control voltage is only possible if the Ckin and Ckfeed signals are exactly in phase (i.e. there is no static phase offset). This is a key difference between the present invention and the previous designs such as the one described in the aforenoted U.S. patent.

As well, the present invention produces a phase relationship between Ckin and Ckfeed signals that is independent of process, temperature and voltage. There will always be variations in the pulse width of the delay line from one phase locked loop to another. However because the POC signal is reset with the delayed version of Ckin and due to the fact that the delay line sets the pulse width of the up signal, these variations have no effect on the phase relationship between the Ckin and Ckfeed signals. Thus a significantly improved structure results.

Figure 6A:
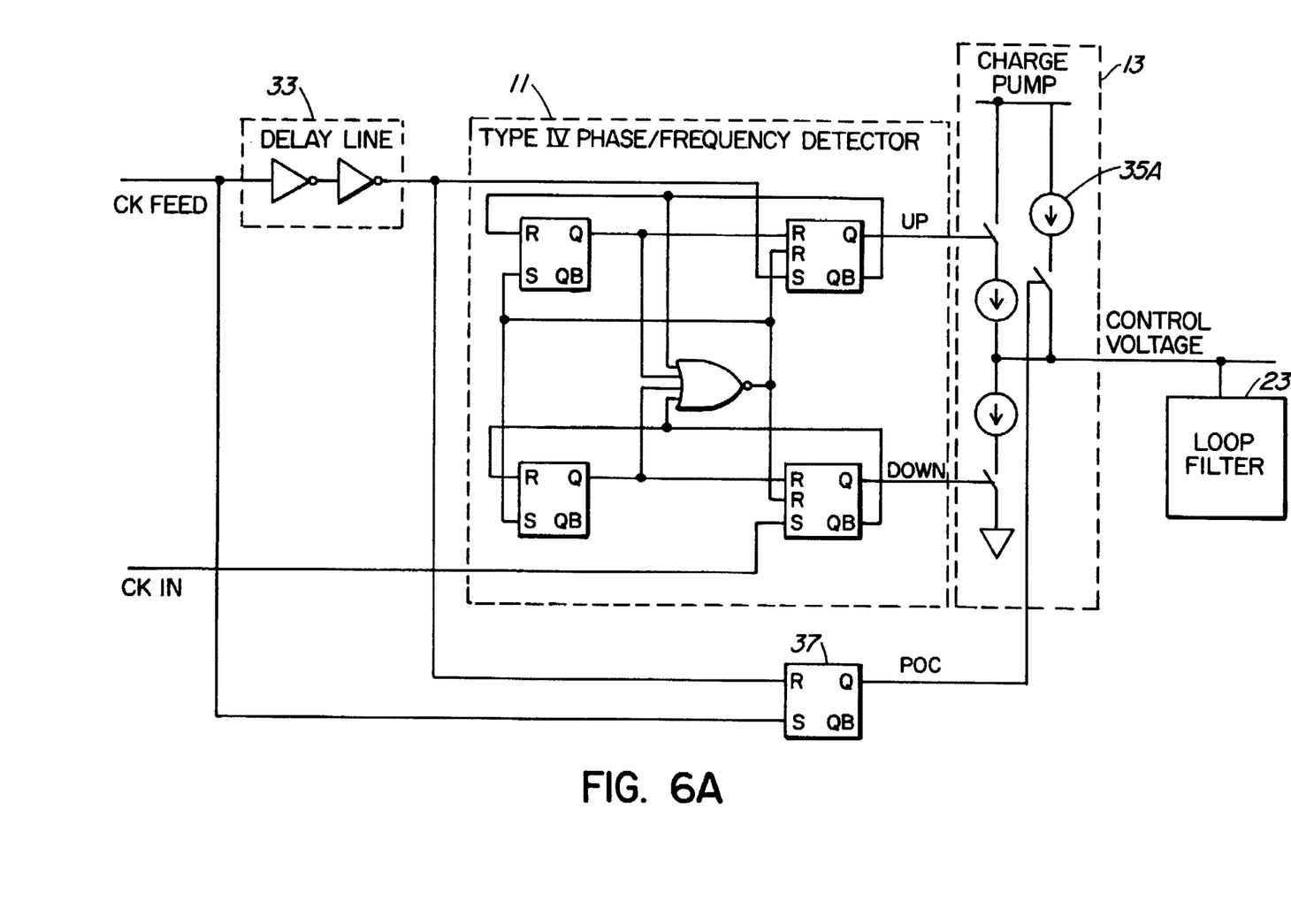

It should be noted that if the delay line is instead in the signal path of the Ckfeed signal, an extra current source 35A is used instead of a current sink in the charge pump, which is driven by latch 37 connected across the delay line in series with the Ckfeed lead as illustrated in FIG. 6A.

Figure 3D:
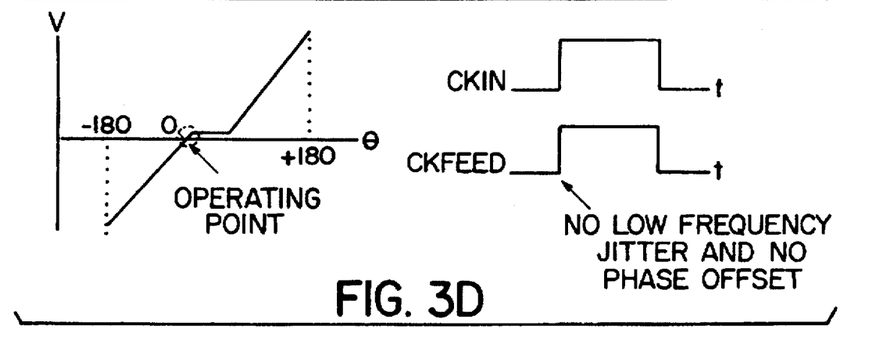

The result is shown in FIG. 3D, wherein the zero phase shift operating point "zero" has been shifted away from the dead zone. Yet as may be seen in the Ckfeed signal, the leading edge is in phase with the Ckin lead, exhibiting no phase offset, and there is no low frequency jitter. This is in contrast with the situation shown in FIG. 3C in which the operating point is shifted away from the dead zone, but the Ckfeed signal leading edge is deliberately offset from the Ckin signal.

A person understanding this invention may now conceive of alternative structures and embodiments or variations of the above. All of those which fall within the scope of the claims appended hereto are considered to be part of the present invention.

We claim:

1. A phase locked loop comprising a charge pump and a phase-frequency detector for providing up and down pulses to the charge pump, said up and down pulses having pulse widths proportional to phase differences between a pair of signals applied thereto, means for introducing a relative phase difference between a first clock signal and a second signal to provide said pair of signals, the second signal being synchronized with an output signal of said loop, means for providing one of a third up pulse and down pulse to the charge pump offsetting the effect of said introduced phase difference, and means for obtaining a loop control voltage from the charge pump.

2. A phase locked loop as defined in claim 1 in which the charge pump includes a current source for providing current with each up pulse and a current sink for sinking current with each down pulse, said introducing means comprising a delay line for delaying said first clock signal prior to reception thereof by the phase-frequency detector, and said third pulse is a down pulse provided to a current sink in said charge pump for sinking current with each pulse thereof.

3. A phase locked loop as defined in claim 2 in which the third pulse is obtained by setting and resetting a latch from said first clock signal and the delayed first clock signal respectively and obtaining an output therefrom.

4. A phase locked loop as defined in claim 1, in which the charge pump includes a current source for providing current with each up pulse and a current sink for sinking current with each down pulse, said introducing means comprising a delay line for delaying said second signal prior to reception thereof by the phase-frequency detector, and said third pulse is an up pulse provided to a current source in said charge pump for sourcing current with each pulse thereof.

5. A phase locked loop as defined in claim 3 in which the third pulse is obtained by setting and resetting a latch from said second signal and the delayed second signal respectively, and obtaining an output therefrom.

6. A phase locked loop comprising:
   (a) a source of reference clock signals,
   (b) a type IV phase-frequency detector for receiving clock signals and for providing up and down output signals proportional to phase differences between the clock signals and a second signal,
   (c) a charge pump for receiving said output signals and for sourcing current with a value of each of said up output signal and for sinking current with a value of each of said down output signal, and for providing a control signal voltage therefrom having value depending on said sourcing current and sinking current,
   (d) an oscillator having the timing of an output signal therefrom controlled by said control signal voltage,
   (e) means for providing said second signal in phase with said oscillator output signal,
   (f) delay means for delaying either said reference clock signals or said second signal prior to application to said phase-frequency detector, and
   (g) means for providing one of a further up signal and down signal to the charge pump for causing sourcing or sinking of current offsetting the effect of the delay of said either of said or said second signal in the output signal.

7. A phase locked loop as defined in claim 6 in which the lengths of said further up and down output signals are proportional to the phase difference between the clock signals and the second signal.

8. A phase locked loop as defined in claim 7 in which the delay means is a delay line connected between the source of the reference clock signals and a clock input of the phase-frequency detector, and in which the means for providing the further down signal to the charge pump is comprised of a multivibrator having set and reset inputs connected to an input and an output respectively of the delay line and an output connected to an enable input of a current sink in the charge pump.

9. A phase locked loop as defined in claim 8 in which the oscillator is a current controlled oscillator, and further including a voltage to current converter connected between the charge pump and said oscillator for receiving the control voltage signal, and a frequency divider connected to the output of the oscillator, and having an output for providing said second signal.

10. A phase locked loop as defined in claim 7 in which the delay means is a delay line for delaying the second signal prior to its application to the phase-frequency detector, and in which the means for providing the further up signals to the charge pump is comprised of a latch having set and reset inputs connected across the delay line and an output connected to an enable input of a current source in the charge pump.

11. A phase locked loop as defined in claim 10 in which the oscillator is a current controlled oscillator, and further including a voltage to current converter connected between the charge pump and said oscillator for receiving the control voltage signal, and a frequency divider connected to the output of the oscillator, and having an output for providing said second signal.

12. A method of controlling the operating point of a Type IV phase-frequency detector which outputs signals proportional to the phase difference between a reference signal and a controlled signal comprising phase offsetting either of said reference therefrom and controlled signal prior to reception by said detector and compensating an output signal under control of a signal resulting from the undelayed and delayed one of the reference signal and the controlled signal so as to cancel the effect of the phase offset between the reference signal and the controlled signal, whereby the operating point of said detector is biased to a position offset from its dead zone but the effect of the bias is avoided in the output signal.

* * * * *